United States Patent
Roy

(10) Patent No.: US 12,213,275 B2
(45) Date of Patent: Jan. 28, 2025

(54) AIR TRANSPORTABLE MODULAR SHIPPING CONTAINER FOR DATA CENTERS

(71) Applicant: Switch, Ltd., Las Vegas, NV (US)

(72) Inventor: Rob Roy, Las Vegas, NV (US)

(73) Assignee: SWITCH, LTD., Las Vegas, NV (US)

(*) Notice: Subject to any disclaimer, the term of this patent is extended or adjusted under 35 U.S.C. 154(b) by 0 days.

(21) Appl. No.: 18/114,886

(22) Filed: Feb. 27, 2023

(65) Prior Publication Data

US 2023/0209764 A1    Jun. 29, 2023

Related U.S. Application Data

(63) Continuation of application No. 16/679,071, filed on Nov. 8, 2019, now Pat. No. 11,606,877.

(60) Provisional application No. 62/757,170, filed on Nov. 8, 2018.

(51) Int. Cl.
| | | |
|---|---|---|
| H05K 7/14 | (2006.01) | |
| E04B 1/348 | (2006.01) | |
| E04H 5/00 | (2006.01) | |
| E04H 5/02 | (2006.01) | |
| H05K 7/20 | (2006.01) | |

(52) U.S. Cl.
CPC ....... *H05K 7/1497* (2013.01); *E04B 1/34815* (2013.01); *E04H 5/02* (2013.01); *H05K 7/20745* (2013.01); *H05K 7/20827* (2013.01); *H05K 7/20836* (2013.01); *E04H 2005/005* (2013.01); *H05K 7/20181* (2013.01); *H05K 7/20309* (2013.01); *H05K 7/20318* (2013.01)

(58) Field of Classification Search
CPC ............ H05K 7/20745; H05K 7/1497; H05K 7/20736; E04H 2005/005; E04H 5/02; E04H 1/005; G06F 1/20
See application file for complete search history.

(56) References Cited

U.S. PATENT DOCUMENTS

| | | | |
|---|---|---|---|
| 10,568,231 B1 | 2/2020 | Metcalf | |
| 2009/0301123 A1* | 12/2009 | Monk | F24F 11/0001 165/56 |
| 2011/0023387 A1 | 2/2011 | Sweeney | |
| 2012/0129442 A1* | 5/2012 | Wei | H05K 7/1497 454/184 |
| 2012/0255710 A1 | 10/2012 | Maselli | |
| 2014/0190191 A1 | 7/2014 | Slessman | |
| 2015/0259938 A1 | 9/2015 | Bernard | |
| 2015/0292753 A1* | 10/2015 | Kutsuzawa | F24F 3/14 454/232 |
| 2015/0342094 A1 | 11/2015 | Ross | |
| 2016/0029508 A1* | 1/2016 | Tabe | H05K 7/1497 361/679.48 |
| 2016/0057892 A1* | 2/2016 | Tabe | H05K 7/20745 361/679.46 |
| 2016/0194863 A1 | 7/2016 | Schmitt | |

(Continued)

*Primary Examiner* — Gisele D Ford
(74) *Attorney, Agent, or Firm* — Dickinson Wright PLLC

(57) ABSTRACT

This invention describes the use of pre-packaged air shipping containers for delivery of edge data center equipment. The containers are capable of rapid deployment and positioning at the edge data center delivery site to minimize time between the order of equipment and deployment of a functioning edge data center. The containers allow for easy access, and rapid repair/replacement of modular edge data center equipment.

20 Claims, 8 Drawing Sheets

(56) References Cited

U.S. PATENT DOCUMENTS

| | | | |
|---|---|---|---|
| 2016/0194893 A1* | 7/2016 | Schmitt | G06F 1/189 |
| | | | 52/173.1 |
| 2016/0198592 A1* | 7/2016 | Schmitt | G06F 1/20 |
| | | | 361/679.46 |
| 2017/0202113 A1 | 7/2017 | Magcale | |
| 2017/0347499 A1 | 11/2017 | Ross | |
| 2017/0359917 A1 | 12/2017 | Bailey | |
| 2017/0359922 A1 | 12/2017 | Bailey | |
| 2017/0367223 A1 | 12/2017 | Bailey | |
| 2018/0077819 A1* | 3/2018 | Roy | H05K 7/20745 |
| 2018/0107255 A1 | 4/2018 | Roy | |
| 2018/0184548 A1* | 6/2018 | Frink | H05K 7/20836 |
| 2018/0191401 A1* | 7/2018 | Sakalkar | G06F 1/18 |

* cited by examiner

AIR TRANSPORTABLE MODULAR SHIPPING CONTAINER FOR DATA CENTERS

BACKGROUND

1. Field of the Invention

The disclosed invention generally relates to pre-packaged, pre-assembled, air-transportable, electronic equipment for edge data centers or edge colocation facility designs and methods of making and using the same in an environmentally aware manner.

2. Background

Data centers and server colocation facilities house electronics equipment. The data center or colocation service provider may provide security services, cooling services, internet connectivity services, and power services to protect the electronics equipment from downtime. In such facilities, rows of electronics equipment, such as servers, typically owned by different entities, are stored. In many facilities, cabinets are used in which electronics equipment is stored, so that only the owners of that equipment, and potentially the facility operator, have access therein. In many instances, the owner of the facilities manages the installation and removal of servers within the facility and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

There are some well-known common aspects to the designs of these facilities. For example, it is known to have the electronic equipment placed in cabinets positioned in rows so that each row of equipment generally forces the heat from the electronic equipment toward a similar area, known as a hot aisle, as that aisle generally contains warmer air that results from the forced heat from the electronics equipment. In the front of the equipment is thus established a cold aisle.

There are different systems for attempting to collect hot air produced by the electronics equipment, cooling that hot air, and then introducing cool air to the electronics equipment. These air-conditioning systems also must co-exist with power and communications wiring for the electronics equipment.

SUMMARY

The present invention relates to a modular, air-transportable data center that provides for rapid transport between distant locations, quick setup and initiation of data center functions, efficient cooling, safe storage, as well as efficient wire routing, and methods of making and using the same in an environmentally aware manner.

The present invention generally provides apparatus and methods for using modular, air-transportable, containerized data center components, and in some embodiments heat shields associated with the same, that may allow for distinct partitioning of air flowing from cold aisles through electronic equipment, into hot aisles as heated air, which is then processed by cooling units into cooled air blown back into the cold aisles by fans, all within a modular, airtight container unit.

Because some embodiments provide for airtight container units to recycle the same supply of air between the hot aisle and cold aisle, the hot aisle and cold aisle are each provided with at least one temperature sensor and at least one pressure sensor. The airtight container units are comprised of a plurality of panels including a floor panel, a back panel, a front panel, a roof panel, and side panels. In a preferred embodiment, the airtight container units are comprised of a plurality of panels including a floor panel, a back panel, a front panel, a main roof panel, an angled roof panel positioned between the front panel and the main roof panel at an obtuse angle, and side panels. At least one safety louver is provided on the front panel that may be selectively opened to break the airtight seal of the container unit in response to the temperature sensors or pressure sensors exceeding a predetermined safety threshold.

At least one container unit is disposed within a data center storage facility. The data center storage facility has its own storage facility air space. The air within the storage facility air space is prevented from mixing with the air inside the airtight container units unless the safety louvers are opened. The data center storage facility is large enough for a user, technician, or operator to walk inside comfortably to access the components within the container unit for service, maintenance, replacement, or transport. The data center storage facility is provided with an access door allowing a person to enter the storage facility air space. The air within the storage facility is maintained at a cool temperature, preferably at or below the cool aisle temperature within the airtight container unit, by a backup cooling unit mounted to a wall outside of the storage facility.

The data center storage unit preferably comprises a curved or angled roof. Such roof configurations prevent buildup of water, snow, or other elements that may cause the roof to break or leak. The curved or angled roof serves as a safety mechanism preventing damage to the electronic equipment, power, and cooling components stored within the data center storage unit.

The data center storage unit preferably comprises heavy-duty, reinforced steel and/or concrete walls and roofing. At least a front side of the data center storage unit is provided with one more access opening to allow the airtight container units to be rapidly transported into and out of the data center storage unit. After the container units are placed within the storage facility, the one or more access openings are sealed with airtight, reinforced steel and/or concrete panels that access panels.

Data center storage units may be provided within a facility, outside a facility, or adjacent to and sharing a common wall with a facility. Multiple data center storage units may be disposed adjacent to each other.

Positioned above the airtight container unit is a busway housing power and connectivity cables and wiring. When more than one container unit is stored within the data center storage facility, the busway may span between the container units to allow power and connectivity cables and wiring to connect between separate container units.

Other container units house power supply units that provide power to electronic equipment and cooling units within adjacent container units. The power supply units are optimally configured as uninterruptible power supplies. The containers housing power supply units may be either stored within the data center storage facility or outside of the data center storage facility. Power cabling is provided from the power supply units to the equipment and components within the container units by common methods known within the art.

The modular data center may further comprise a second container having a power supply disposed therein. The power supply provides power to the at least one cooling unit and electronic equipment. Each of the at least one cooling units comprise an evaporator, a condenser, and at least one fan.

Dimensions of the plurality of panels are configured for optimal storage within an airplane cargo space. As an additional consideration, the dimensions of the plurality of panels may also be configured for optimal storage within a tractor-trailer container. The plurality of panels create an airtight seal around the at least one cabinet, the at least one cooling unit, the heat shield, the cold aisle air space, and the hot aisle air space. The back panel and the front panel each comprise a plurality of selectively openable louvers. The cold aisle air space and the hot aisle air space each have at least one temperature sensor and at least one pressure sensor disposed therein. The selectively openable louvers are configured to move from a closed position to an open position when either the at least one temperature sensor or the at least one pressure sensor read a value exceeding a predetermined threshold value.

The plurality of panels creates an airtight seal around the at least one cabinet, the at least one cooling unit, the heat shield, the cold aisle air space, and the hot aisle air space, and separates the cold aisle air space and the hot aisle air space from the storage unit air space. The storage unit comprises an entry door and at least one selectively removable access panel. The storage unit comprises a backup cooling unit.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION OF THE PREFERRED EMBODIMENTS

The present invention generally provides apparatus and methods for using modular, air-transportable containerized data center unit components, and heat management associated with the same that allow for rapid deployment, delivery, and implementation of edge data centers. In some embodiments the invention provides distinct partitioning of air flowing from cold aisles through electronic equipment, into hot aisles as heated air, which is then processed by cooling units into cooled air blown back into the cold aisles by fans, all within a modular, airtight container unit.

Figure 1:
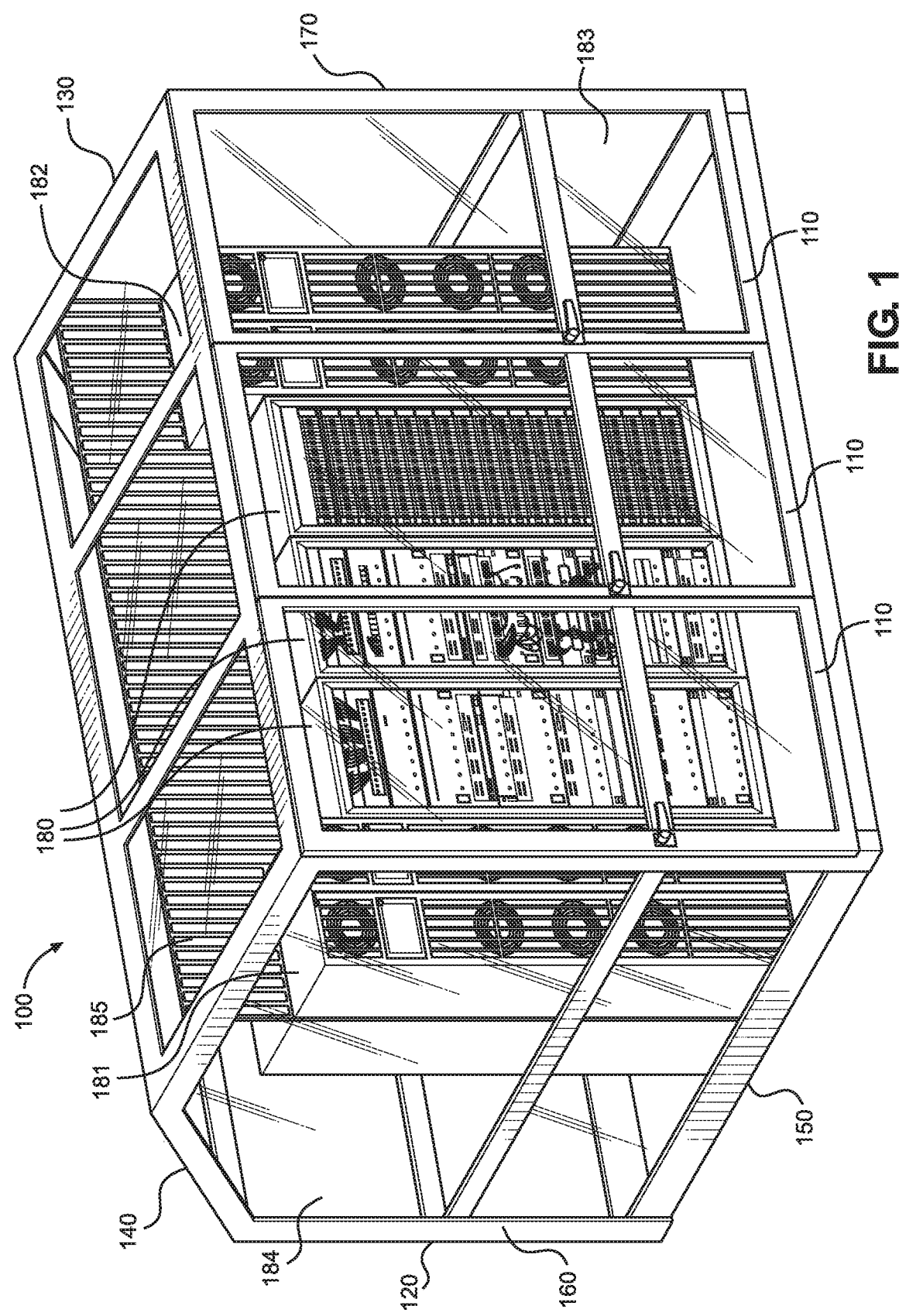
FIG. 1 illustrates a perspective view of an air-transportable data center container unit according to an embodiment of the present invention.

FIG. 1 illustrates an airtight container unit 100. The container unit 100 comprises a front side having front-side door panel(s) 110, rear panel(s) 120, main roof panel(s) 130, angled roof panel(s) 140 positioned at an obtuse angle between front-side door panel(s) 110 and the main roof panel(s) 130, floor panel(s) 150, first side panel(s) 160, and second side panel(s) 170. Together, the container unit panels preferably create an airtight interior for housing data center components. Front-side door panel(s) 110 may be optionally pre-assembled on the shipping container unit 100 or installed on the shipping container unit 100 after delivery to the edge data center site. Front-side door panel(s) 110 comprise hinged doors with handles to allow access to a front side of the electronic equipment cabinets 180 for equipment installation and maintenance. Any or all of the aforementioned panels may include glass, plastic, or other see-through panels to allow visibility into the container unit 100 from outside of the container.

Disposed within the airtight container unit 100 is at least one but preferably a plurality of electronic equipment cabinets 180. The electronic equipment cabinets 180 and their equipment may be pre-packaged inside of the container 100 and simply connected to the appropriate power and connectivity cabling once delivered to the edge data center location to being their function. Once positioned at the edge data center site, the electronic equipment cabinets may remain within the container unit 100, and only need to be properly positioned and connected to begin their functions. The electronic equipment cabinets 180 store heat producing electronic equipment such as servers. Shown adjacent to the electronic equipment cabinets 180 in FIG. 1 are fan units 181 and 182. The fan units 181 and 182 comprise at least one fan assembly. The electronic equipment cabinets 180 and fan units 181/182 are sized and positioned side-by-side to span the entire width of the container unit 100. Sides of the fan units 181/182 press up against the first side panel(s) 160 and second side panel(s) 170. This configuration of cabinets 180 and cooling units 181/182 is provided such that no air passes between the cabinets 180, fan units 181, and side panels 160/170 from a front side, cold aisle air space 183 to the rear side, hot aisle air space of the cabinets and fan units 181/182. A heat shield 185 is positioned above the cabinets 180 and fan units 181/182 such that the heat shield 185 seals the cold aisle air space 183 from the hot aisle air space 184.

The heat shield 185 may comprise a plastic curtain, steel or plastic panel, plexiglass, or any other suitable material. The heat shield 185 preferably comprises at least one layer of heat insulating material. The heat shield is fixed in a position contacting the main roof panel(s) 130, first side panel(s) 160, second side panel(s) 70, and top surfaces of the cabinets 180 and fan units 181/182 to seal air between cold aisle air space 183 and hot aisle air space 184, and preventing heat from transferring between cold aisle air space 183 and hot aisle air space 184. This configuration directs all of the air in the cold aisle air space 183 into the electronic equipment within the cabinet 180 when they are in operation. The electronic equipment then exhausts heated air into the hot aisle air space 184.

To recycle air back into the cold aisle air space 183, fan units 181/182 intake heated air within the hot aisle air space 184. Evaporator units and condenser units of the fan units 181 process the heated air converting it to cooled air, and fans blow the cooled air back into cold aisle air space 183. All of the panels of the container unit 100 preferably comprise at least one layer of heat insulating material to prevent heat transfer between the interior air space of the container unit 100 and air outside of the container unit 100.

In a preferred embodiment the width of the container unit is 10.5 feet wherein the width is defined as the distance between the first side panel(s) 160 and second side panel(s) 170. In this preferred embodiment the length of the container is 8 feet wherein the length is defined as the distance between the front panel(s) 110 and the back panel(s) 120. Also in this preferred embodiment the height of the container is 8 feet wherein the height is defined as the distance between the main roof panel(s) 130 and the floor panel(s) 150. These dimensions are chosen to be optimal for placing the air-transportable container units 100 within the cargo space of a cargo plane.

In other embodiments the width of the container may be about 10.5 feet, the length may be about 8 feet, and the height may be about 8 feet. In other embodiments the width of the container may be less than 10.5 feet, the length may be less than 8 feet, and the height may be less than 8 feet. In other embodiments the width of the container may be more than 10.5 feet, the length may be more than 8 feet, and the height may be more than 8 feet. The invention contemplates the dimensions of the container may be chosen, selected, and implemented to suit the needs of the particular user.

The front panel(s) 110 and back panel(s) 120 may comprise a plurality of vertically or horizontally disposed louvers (not shown). The louvers are maintained in a closed position when the electronic equipment is in use to maintain the airtight seal of the container unit 100. Positioned within the each of the cold aisle air space and hot aisle airspace are at least one temperature sensor and pressure sensor. The temperature sensors and pressure sensors communicate temperature and pressure values for their respective air spaces to a control unit. When the control unit reads a temperature or pressure that exceeds a predetermined safety value, the control unit sends signals that open the louvers of the respective side or sides necessary, breaking the airtight seal of the container unit 100. As an emergency backup, the air space outside of the container unit 100 is kept at a temperature at or below the temperature of the cold aisle air space, as discussed in further detail below.

Figure 2:
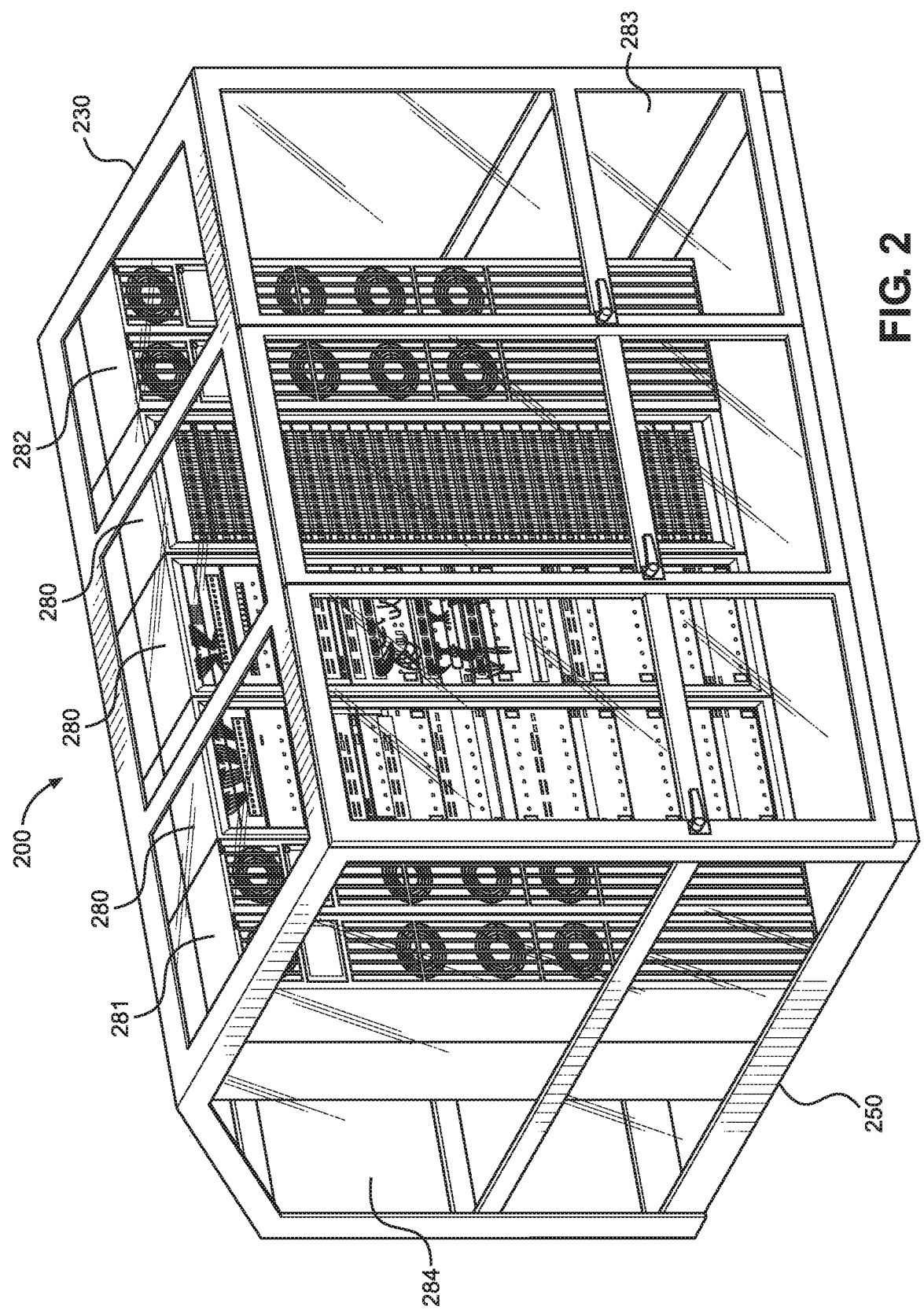
FIG. 2 illustrates a perspective view of an air-transportable data center container unit according to another embodiment of the present invention.

FIG. 2 illustrates an alternative embodiment 200 of the container unit shown in FIG. 1. This container unit 200 does not include a heat shield, but rather the cabinets 280 and fan units 281/282 extend from the floor panel(s) 250 to the main roof panel(s) 230 and when coupled with fan units 281/282, span the entire width of the container unit 200 to completely divide the cold aisle air space 283 from the hot aisle air space 284. In the embodiment of FIG. 2, the main roof panel(s) 230 and angled roof panel(s) 240 are open to allow the hot aisle air space 284 to be cooled by overhead cold water cooling. Front-side door panel(s) 110 may be optionally pre-assembled on the shipping container unit 100 or installed on the shipping container unit 100 after delivery to the edge data center site. Front-side door panel(s) 210 comprise hinged doors with handles to allow access to a front side of the electronic equipment cabinets 280 for equipment installation and maintenance.

Figure 3:
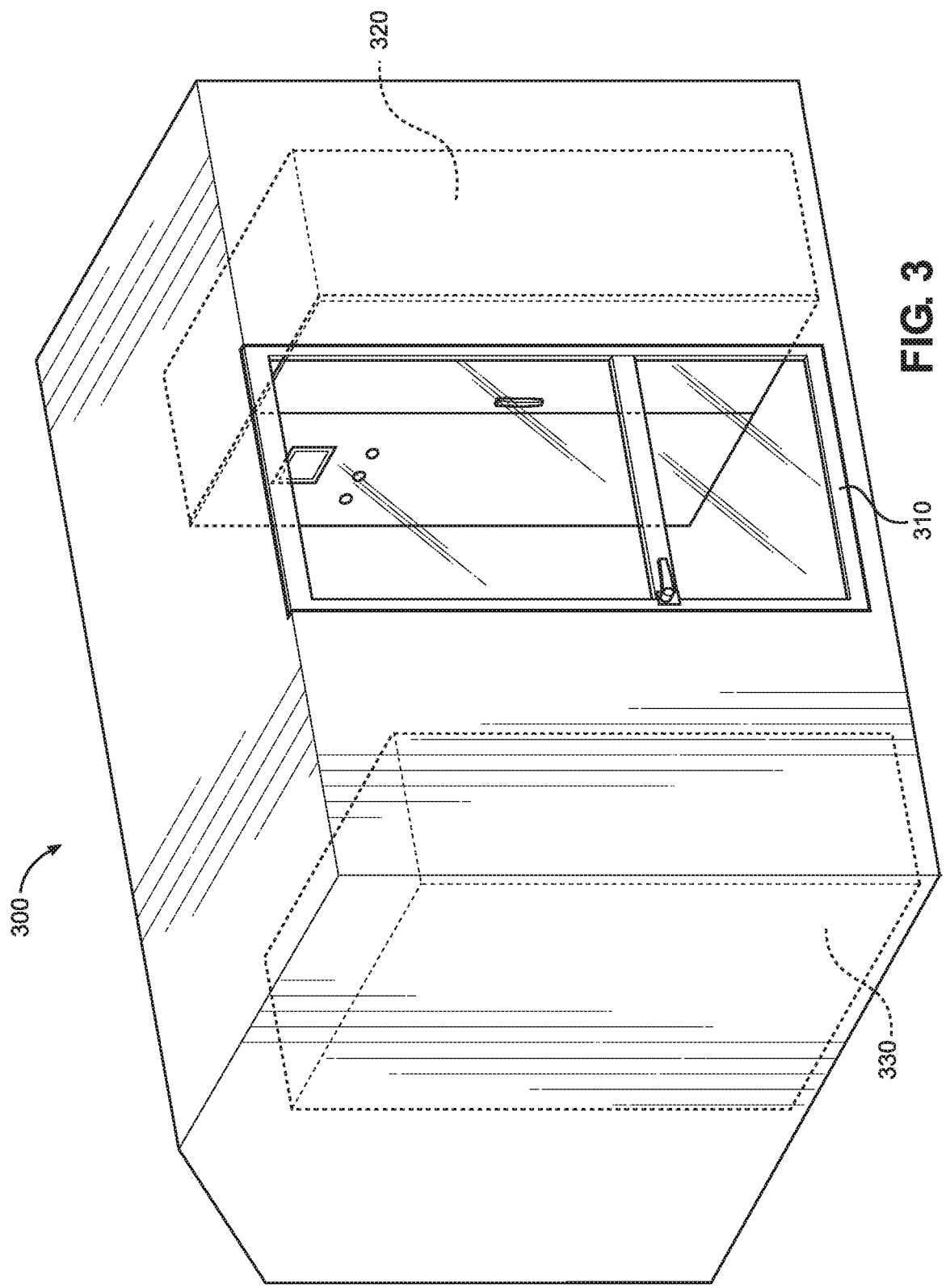
FIG. 3 illustrates a perspective view of an air-transportable data center container unit according to another embodiment of the present invention.

FIG. 3 illustrates another embodiment of the present invention. Here, the container unit 300 houses a remote power panel (RPP) unit 320 and an uninterruptible power supply (UPS) 330. As with prior embodiments, the RPP and UPS may be pre-packaged into the container unit 300 and simply connected to appropriate power distribution cabling once delivered to the edge data center location. The RPP and UPS may remain within the container unit 300, and only need to be properly positioned and connected to begin their powering functions. The container unit 300 may be provided with a front-side door panel 310. The front-side door panel 310 may include glass panels to allow visibility into the container unit 300 from outside of the container.

Figure 4:
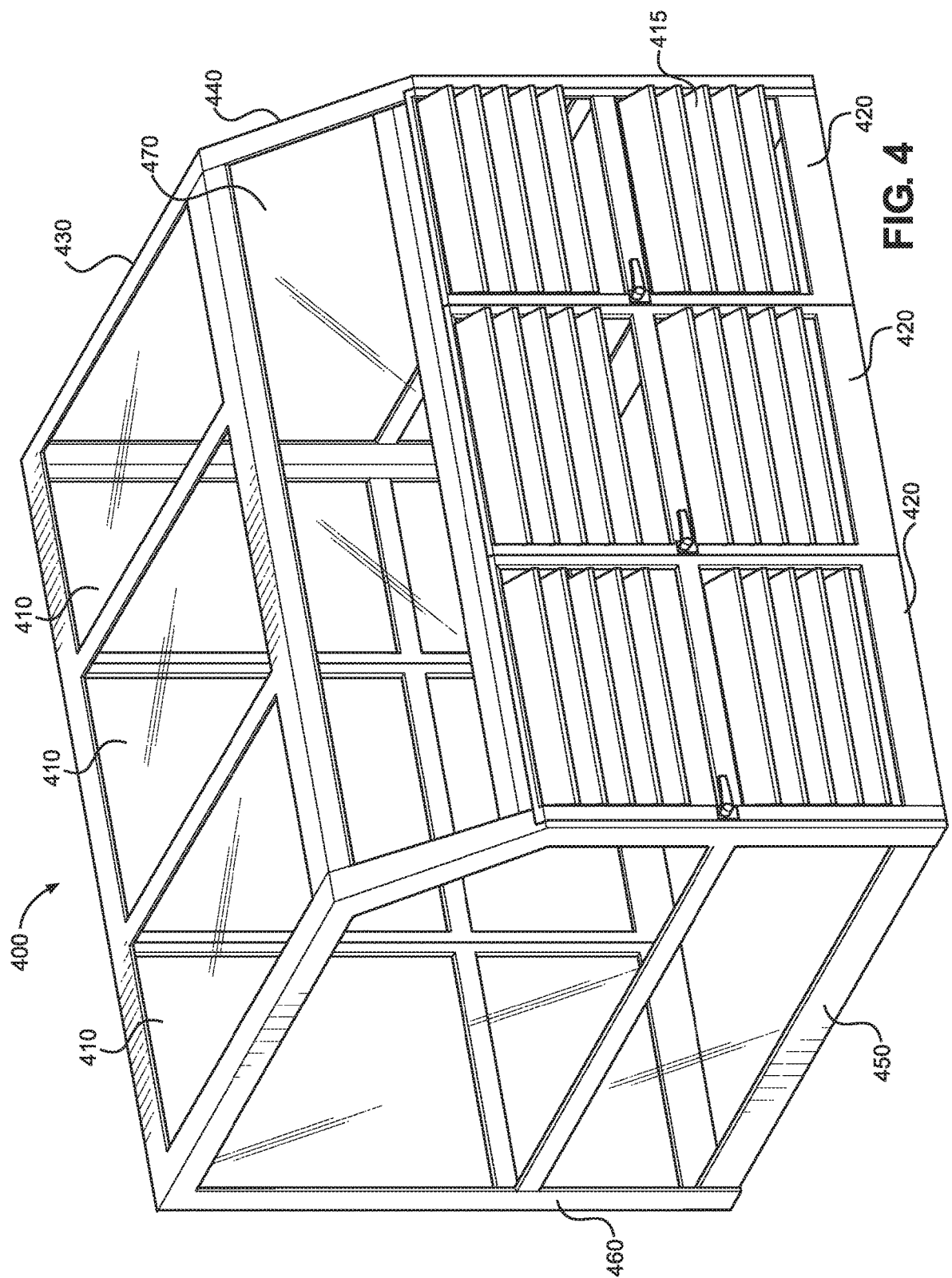
FIG. 4 illustrates a rear-perspective view of an air-transportable data center container unit according to another embodiment of the present invention.

FIG. 4 illustrates another embodiment of the present invention. Here, the rear panel(s) 420 comprise hinged doors with handles and horizontally disposed louvers 415 spanning the entire width and height of the rear panel(s) 420 frames. The louvers 415 will remain closed during routine operation of the equipment inside of the container 400. In response to signals received from sensors positioned with the container 400, the louvers 415 will automatically open to relieve pressure and/or dissipate heat from within the container 400.

Figure 5:
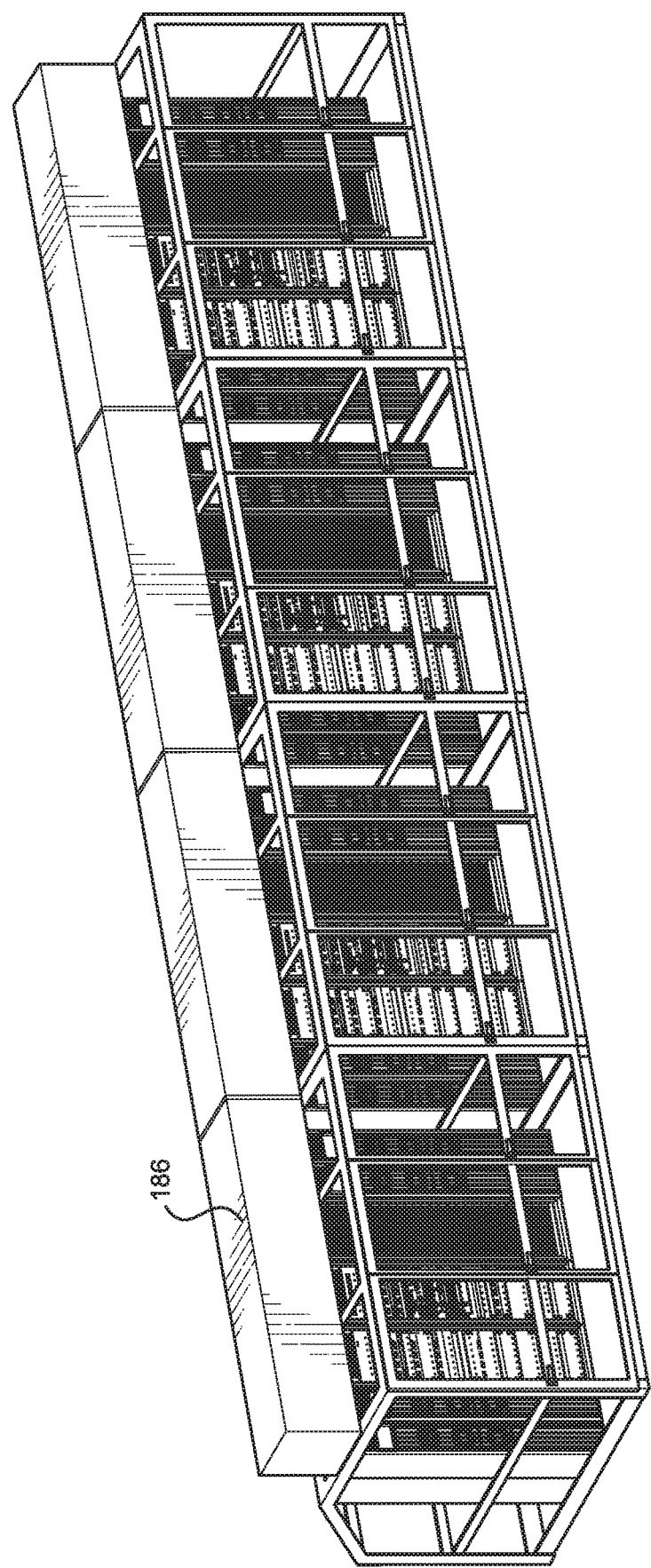
FIG. 5 illustrates a perspective view of a plurality of air-transportable data center container units shown in FIG. 2.

FIG. 5 illustrates a plurality of the air-transportable container units 100 positioned side-by-side. Positioned above the container units are busways 186 for housing power and connectivity wires and cabling. The busways 186 may be divided into separate compartments (not shown) so that connectivity wires and cabling are stored in a separate compartment from power wires and cabling. The busways may be configured as individual units, a plurality of units, or one long unit so that power and connectivity wires and cabling may connect between data center components within adjacent container units 100. Wire and cabling trays (not shown) may also be provided within the cold aisle airspace 183 or hot aisle airspace 184 to connect to the electronic equipment in the cabinets 180.

Figure 6:
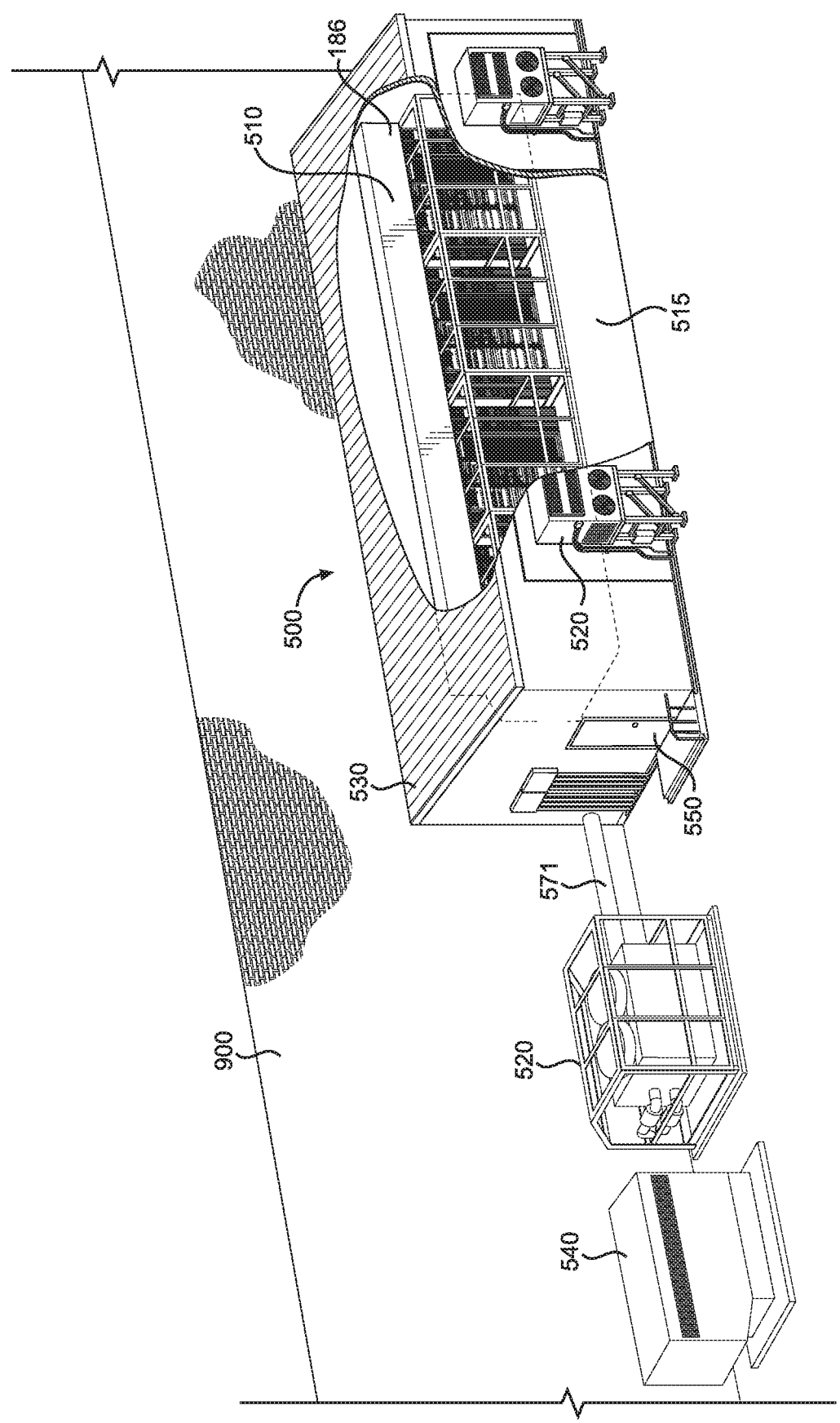
FIG. 6 illustrates a perspective cut-away view of a data center storage facility housing air-transportable data center container units of FIG. 2 according to an embodiment of the present invention.

FIG. 6 illustrates the container units 100 and busways 186 positioned within a data center storage facility 500. Positioned between the data center storage facility and the container units 100 is storage facility airspace 510. Storage facility airspace 510 is maintained at a temperature at or below the cold aisle airspace 183 by an external wall mounted backup cooling unit 520. The storage facility airspace within is prevented from mixing with the air inside the airtight container units 100 unless the safety louvers are opened. Heat is prevented from transferring between the storage facility airspace and the air within the container units by the heat insulating material of the container unit panels. The data center storage facility is large enough for a user, technician, or operator to walk inside comfortably to access the components within the container unit 100 for service, maintenance, replacement, or transport.

The data center storage facility 500 preferably comprises a curved or angled roof 530. Such roof configurations prevent buildup of water, snow, or other elements that may cause the roof to break or leak. The curved or angled roof serves as a safety mechanism preventing damage to the electronic equipment, power, and cooling components stored within the data center storage unit.

FIG. 6 also illustrates chiller units 520 and power supply units 540 positioned within air-transportable container units adjacent to the data center storage facility 500. The power supply units 540 are preferably uninterruptable power supplies, although any known power supply unit capable of providing the required power may be suitable. The chiller units 520 and power supply units 540 may be pre-packaged within their container unit prior to shipping to the edge data center location, and merely need to be properly connected to begin their function once they arrive on site. The chiller units 520 are connected to cool water and provide the chilled water through piping into the edge data center to manage heat. The power supply units 540 are connected to provide power to the data center components, electronic equipment, cooling units, louvers, sensors, and fans within container units inside the data center storage facility 500. Multiple data center storage facilities 500 may be positioned adjacent to one another to meet client capacity needs.

The containers housing chiller units 520 and power supply units 540 may be either stored within the data center storage facility or outside of the data center storage facility. Power cabling is provided from the power supply units to the equipment and components within the container units by common methods known within the art.

Figure 7:
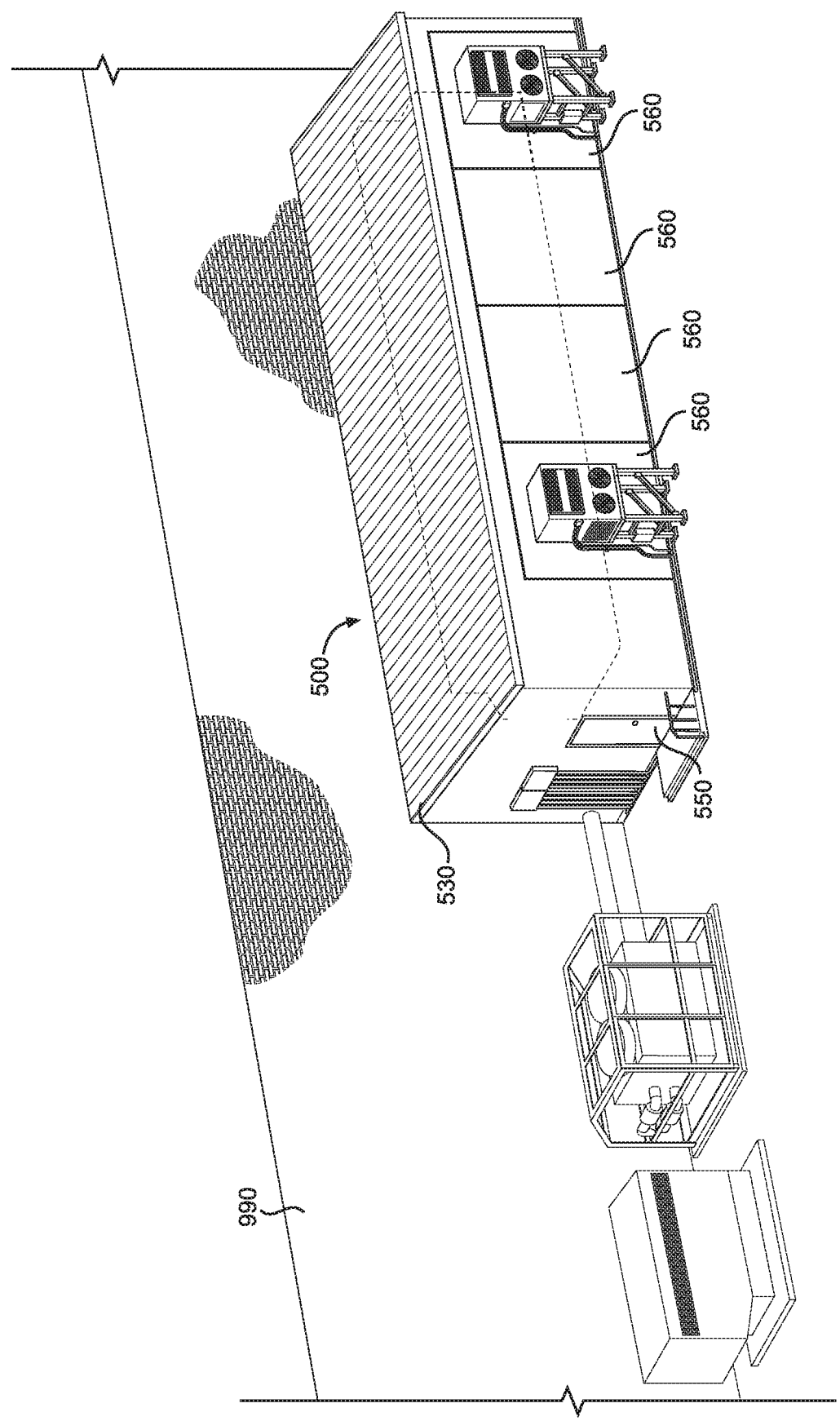
FIG. 7 illustrates a perspective view of the data center storage facility shown in FIG. 6.

FIGS. 6 and 7 illustrate the data center storage facility is provided with an access door 550 allowing a person to enter the storage facility air space to provide service or maintenance to the data center component, replacement data center components or container units, or transport data center components or container units. The data center storage unit 500 preferably comprises heavy-duty, reinforced steel and/or concrete walls and roofing. FIG. 7. Illustrates that at least a front side of the data center storage unit 500 is provided with one or more access openings 560 to allow the airtight container units to be rapidly transported into and out of the data center storage unit. After the container units are placed within the storage facility, the one or more access openings are sealed with airtight, reinforced steel and/or concrete panels that serve as access panels.

Figure 8:
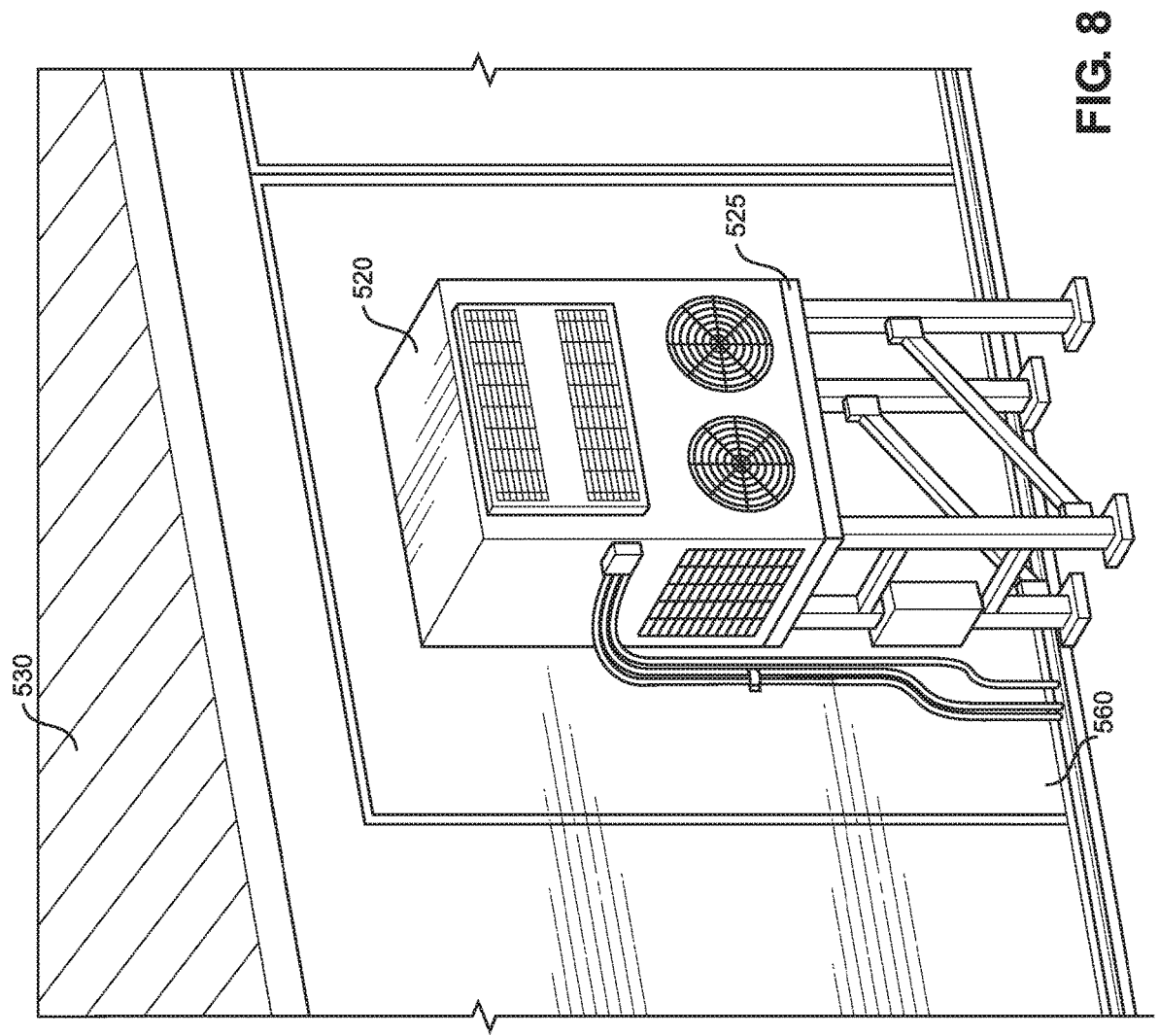
FIG. 8 illustrates a close-up perspective view of a cooling unit for the data center storage facility shown in FIGS. 6 and 7.

FIG. 8 illustrates a close-up perspective view of the external wall mounted backup cooling units 520, which penetrate the one or more access opening 560 to maintain storage facility airspace 510 at a temperature at or below the cold aisle airspace 183 temperature. The external wall mounted backup cooling units 520 may be positioned on a raised stand 525.

Data center storage units 500 may be provided within a facility, outside a facility, or adjacent to and sharing a common wall 900 with a facility. Multiple data center storage units may be disposed adjacent to each other.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

What is claimed is:

1. A modular data center comprising:
  a first container comprising a plurality of panels, disposed within the first container are:
    at least one cabinet with electronic equipment disposed therein;
    at least one cooling unit; and
    a heat shield, the heat shield positioned to establish a cold aisle air space on one side of the heat shield within the first container and a hot aisle air space on the opposite side of the heat shield within the container,
  wherein the electronic equipment and the at least one cooling unit are positioned side by side such that no air passes therebetween in order that air is processed by the at least one cooling unit from the hot aisle air space and blown back by the at least one cooling unit directly into the cold aisle air space, and in order that air flows through the electronic equipment directly to the hot aisle air space, wherein the plurality of panels create a seal around the at least one cabinet, the at least one cooling unit, the heat shield, the cold aisle air space, and the hot aisle air space, wherein the at least one cooling unit comprises a first cooling unit and a second cooling unit, and wherein the electronic equipment contacts each of the first cooling unit and the second cooling unit and extends from the first cooling unit to the second cooling unit; and wherein the first and second cooling units each engage one of the panels of the first container.

2. The modular data center according to claim 1, further comprising a second container having a power supply disposed therein.

3. The modular data center according to claim 2, wherein the power supply provides power to the first and second cooling units and the electronic equipment.

4. The modular data center according to claim 1, wherein each of the first and second cooling units comprise an evaporator, a condenser, and at least one fan.

5. The modular data center according to claim 1, wherein the plurality of panels comprises:
  a floor panel;
  a back panel;
  a front panel;
  a roof panel;
  side panels; and
  wherein the cooling units each engage one of the side panels of the first container.

6. The modular data center according to claim 5, wherein dimensions of the plurality of panels are configured for optimal storage within an airplane cargo space.

7. The modular data center according to claim 5, wherein the plurality of panels create an airtight seal around the at least one cabinet, the first and second cooling units, the heat shield, the cold aisle air space, and the hot aisle air space.

8. The modular data center according to claim 7, wherein the back panel and the front panel each comprise a plurality of selectively openable louvers.

9. The modular data center according to claim 8, wherein the cold aisle air space and the hot aisle air space each have at least one temperature sensor and at least one pressure sensor disposed therein.

10. The modular data center according to claim 9, wherein the selectively openable louvers are configured to move from a closed position to an open position when either the at least one temperature sensor or the at least one pressure sensor read a value exceeding predetermined threshold value.

11. The modular data center according to claim 1, wherein the plurality of panels comprises:
  a floor panel;
  a back panel;
  a front panel;
  a main roof panel substantially parallel to the floor panel;
  an angled roof panel disposed between the main roof panel and the front panel; and
  side panels.

12. The modular data center according to claim 11, wherein dimensions of the plurality of panels are configured for optimal storage within an airplane cargo space.

13. The modular data center according to claim 11, wherein the back panel and the front panel each comprise a plurality of selectively openable louvers.

14. The modular data center according to claim 13, wherein the cold aisle air space and the hot aisle air space each have at least one temperature sensor and at least one pressure sensor disposed therein.

15. The modular data center according to claim 14, wherein the selectively openable louvers are configured to move from a closed position to an open position when either the at least one temperature sensor or the at least one pressure sensor read a value exceeding a predetermined threshold value.

16. A modular data center comprising:
   a storage unit, disposed within the storage unit are:
      a first container comprising a plurality of panels, disposed within the first container are:
         at least one cabinet with electronic equipment disposed therein;
         at least one cooling unit; and
         a heat shield, the heat shield positioned to establish a cold aisle air space on one side of the heat shield within the first container and a hot aisle air space on the opposite side of the heat shield within the container;
      a second container having a power supply disposed therein, the power supply providing power to the at least one cooling unit and electronic equipment; and
      storage unit air space,
         wherein the electronic equipment and the at least one cooling unit are positioned side by side such that no air passes therebetween in order that air is processed by the at least one cooling unit from the hot aisle air space and blown back by the at least one cooling unit directly into the cold aisle air space, and in order that air flows through the electronic equipment directly to the hot aisle air space, wherein the plurality of panels create a seal around the at least one cabinet, the at least one cooling unit, the heat shield, the cold aisle air space, and the hot aisle air space, wherein the at least one cooling unit comprises a first cooling unit and a second cooling unit, and wherein the electronic equipment contacts each of the first cooling unit and the second cooling unit and extends from the first cooling unit to the second cooling unit; and wherein the first and second cooling units each engage one of the panels of the first container.

17. The modular data center according to claim 16, wherein the storage unit comprises an entry door and at least one selectively removable access panel.

18. The modular data center according to claim 16, wherein the storage unit comprises a backup cooling unit.

19. A modular data center comprising:
   a first container comprising a plurality of panels comprising a floor panel, a back panel, a front panel, a roof panel, and side panels, wherein disposed within the first container are:
      at least one cabinet with electronic equipment disposed therein;
      a first cooling unit; and
      a second cooling unit, the electronic equipment contacting each of the first and second cooling units and extending from the first cooling unit to the second cooling unit,
   wherein the electronic equipment and the first and second cooling units each extend from the floor panel to the roof panel, wherein the electronic equipment and the first and second cooling units together span an entire width of the first container in order to establish a cold aisle air space on one side and a hot aisle air space on an opposite side thereof, wherein the electronic equipment and the first and second cooling units are positioned side by side such that no air passes therebetween in order that air is processed by the at least one cooling unit from the hot aisle air space and blown back by the at least one cooling unit directly into the cold aisle air space, and in order that air flows through the electronic equipment directly to the hot aisle air space, and wherein the plurality of panels create a seal around the at least one cabinet, the first and second cooling units, the cold aisle air space, and the hot aisle air space; and wherein the cooling units each engage one of the side panels of the first container.

20. The modular data center according to claim 19, wherein the roof panel is an open roof panel in order to allow the hot aisle air space to be cooled by overhead cold water cooling.

* * * * *